(12) United States Patent
Hoggarth et al.

(10) Patent No.: US 6,677,876 B1
(45) Date of Patent: Jan. 13, 2004

(54) DIFFERENTIAL SIGMA-DELTA DAC WITH DYNAMIC SPECTRAL SHAPING

(75) Inventors: Steven P. Hoggarth, Sunrise, FL (US); Edward Diaz, Miami, FL (US); Raul Salvi, Boca Raton, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/228,580

(22) Filed: Aug. 27, 2002

(51) Int. Cl.[7] ................................................. H03M 3/00
(52) U.S. Cl. ....................................................... 341/143
(58) Field of Search ......................................... 341/143

(56) References Cited

U.S. PATENT DOCUMENTS

| | | | |
|---|---|---|---|
| 5,760,722 A | * | 6/1998 | Harris et al. ................. 341/143 |
| 5,821,890 A | | 10/1998 | Kim et al. .................... 341/143 |
| 6,137,430 A | | 10/2000 | Lyden et al. ................. 341/145 |
| 6,340,940 B1 | * | 1/2002 | Melanson .................... 341/143 |
| 6,344,812 B1 | * | 2/2002 | Takeda et al. ............... 341/143 |
| 2002/0171572 A1 | * | 11/2002 | Yamamoto .................. 341/143 |

OTHER PUBLICATIONS

Yasuyuki Matsuya, Kuniharu Uchimura, Atsushi Iwata, and Takao Kaneko; A 17–Bit Oversampling D–To–A Conversion Techniology Unig Multistage Noise Shaping; IEEE Jornal of Solid–State Circuits, vol. 24, No. 4, Aug. 1989; pp. 969–975.

* cited by examiner

Primary Examiner—Howard L. Williams
(74) Attorney, Agent, or Firm—Posz & Bethards, PLC; Charles W. Bethards

(57) ABSTRACT

A sigma-delta DAC circuit 10 includes a sigma-delta modulator 12 for producing and outputting an n-bit digital signal representative of an input analog signal, wherein n is a positive integer greater than 1, and is preferably equal to 4, 5 or 6. A differential n-bit DAC 30 is for converting a $2^{n-1}$-bit digital signal and a $2^{n-1}$-bit inverted digital signal processed and output by a bit shifter 24 and a differential decoder 18 to a differential analog signal. The sigma-delta modulator has a movable zero for enabling dynamic spectral shaping of the differential analog signal.

20 Claims, 2 Drawing Sheets

DIFFERENTIAL SIGMA-DELTA DAC WITH DYNAMIC SPECTRAL SHAPING

BACKGROUND OF THE INVENTION

1. Field of the Invention

The present invention relates to digital to analog conversion technology, and specifically to a sigma-delta digital to analog converter having dynamic spectral shaping.

2. Description of Related Art

Communications components such as CDMA processing transmitters require that a processed digital signal be converted back to an analog signal through a digital to analog converter circuit (DAC circuit) prior to transmission. A sigma-delta DAC circuit is preferred in such applications because it is simpler in design than a conventional DAC circuit. This is because a higher percentage of the design of a sigma-delta DAC circuit is in the digital domain compared to a conventional DAC circuit, which is implemented with a larger number of analog components such as resistors, transistors and current sources. In addition, because such a large portion of its design is in the digital domain, a sigma-delta DAC circuit can generically be re-used in subsequent higher frequency applications and processes, while a conventional DAC circuit is typically tied to a particular application due to its relatively large number of analog components and therefore must be re-engineered prior to use in each subsequent application.

While sigma-delta DAC circuits are advantageous with respect to conventional DAC circuits in many applications, certain limitations do exist with respect to their design and operation. For example, a conventional sigma-delta modulator with static characteristics may require a higher order filter, such as a $3^{rd}$ or $4^{th}$ order filter, or higher operating frequency to meet similar specifications. These higher order filters require more operating current, and are less stable than lower order filters. Further, DACs used in conventional sigma-delta DAC circuits are susceptible to power supply noise because of their single input, single output design. The above limitations of a sigma-delta DAC circuit must therefore be considered in the design of, for example, wideband CDMA communications devices in which parameters such as cost and battery power are critical.

What is needed is a sigma-delta DAC circuit with dynamic spectral shaping that provides results similar to higher order sigma-delta DAC circuits at lower associated costs and power requirements.

BRIEF DESCRIPTION OF THE DRAWINGS

Objects and advantages of the present invention will be more readily apparent from the following detailed description of preferred embodiments thereof when taken together with the accompanying drawings in which.

DETAILED DESCRIPTION OF THE PRESENTLY PREFERRED EXEMPLARY EMBODIMENTS

In overview form the present disclosure concerns sigma-delta digital to analog converters (DACs) having dynamic spectral shaping characteristics particularly suited for but not limited to use in communications devices or units, such as cellular phones or handsets and the like. More particularly various inventive concepts and principles embodied in such sigma-delta digital to analog converters and methods therein provide a zero in the frequency response or transfer function that can be dynamically moved about thereby resulting in smaller lower cost and energy consumption DAC devices.

The instant disclosure is provided to further explain in an enabling fashion the best modes of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions. Much of the inventive functionality and many of the inventive principles are best implemented with or in software programs or instructions or integrated circuits (ICs) such as application specific ICs or custom ICs. It is expected that one of ordinary skill, not-withstanding possibly significant effort and many design choices motivated by, for example, available time, current technology, and economic considerations, when guided by the concepts and principles disclosed herein will be readily capable of generating such software instructions and programs or ICs with minimal experimentation. Therefore, in the interest of brevity and minimization of any risk of obscuring the principles and concepts according to the present invention, further discussion of such software and ICs, if any, will be limited to the essentials with respect to the principles and concepts used by the preferred embodiments.

Figure 1:
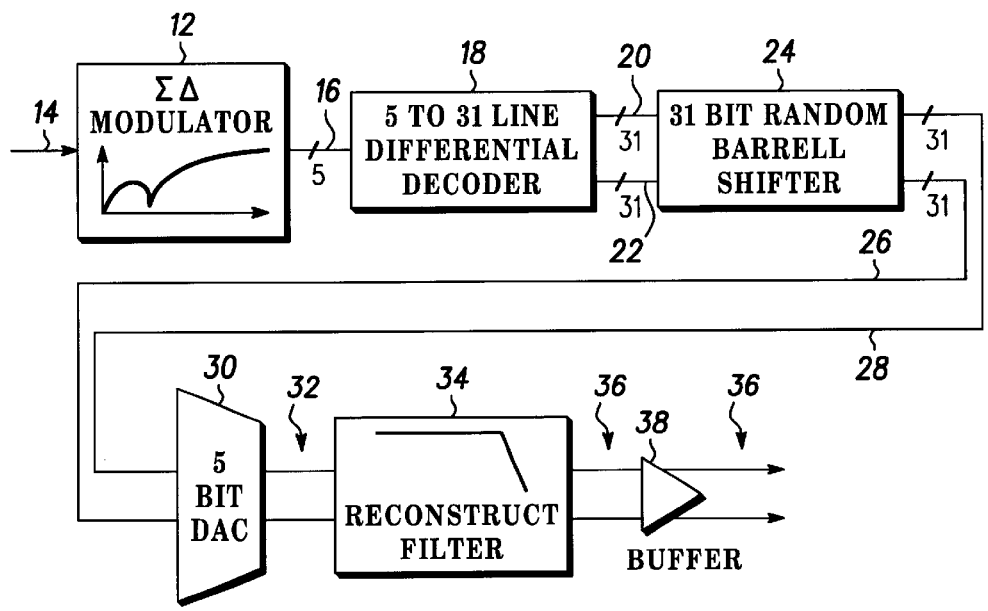
FIG. 1 is a block diagram of a sigma-delta DAC circuit according to a preferred embodiment of the present invention.

Referring now to the drawings in which like numerals reference like parts, FIG. 1 shows a sigma-delta DAC circuit 10 according to a preferred embodiment of the present invention. The sigma-delta DAC circuit 10 is designed for baseband transmitters and signal processing circuits used in, for example, GSM, CDMA or IS136 protocol type cellular phones, cable set top boxes, cable and telephone modems, digital televisions, personal digital assistants and the like that require dynamic adaptation to changing spectral outputs. However, its contemplated uses may extend to any signal processing application in which cost, size, stability and processing flexibility are important design parameters.

The sigma-delta DAC circuit 10 includes a sigma-delta modulator 12 for receiving an input high resolution digital signal represented generally at and for producing and outputting a 5-bit digital signal 16, which is essentially a series of rapidly changing pulses having a time averaged value equivalent to the input signal 14. A differential decoder 18 is connected to the sigma-delta modulator 12 and is for decoding and converting the 5-bit digital signal 16 input from the sigma-delta modulator 12 to a differential 31-bit digital signal 20 and a 31-bit inverted digital signal 22. A bit shifter 24 is connected to the differential decoder 18 for averaging out bit mismatch in the differential 31-bit digital signal 20 and the 31-bit inverted digital signal 22 input from the differential decoder 18 to produce an averaged 31-bit digital signal 26 and an averaged 31-bit inverted digital signal 28. The bit shifter 24, which is preferably a 31-bit random barrel shifter, averages the time on the current sources in a 5-bit DAC 30 to move current source mismatch error up in frequency so that an $m^{th}$ order smoothing filter (where m is a positive integer greater than 0), such as a $2^{nd}$ order reconstruction filter 34, helps to eliminate it.

The 5-bit DAC 30, connected to the bit shifter 24, is for converting the averaged 31-bit digital signal 26 and the averaged 31-bit inverted digital signal 28 from the bit shifter 24 to a differential analog signal 32. The $2^{nd}$ order reconstruction filter 34 is for filtering noise from the differential analog signal 32 in a manner known in the art and as already discussed to produce a filtered differential analog signal 36, while a buffer 38 is for receiving the filtered differential analog signal 36 from the reconstruction filter 34, for matching a sigma-delta DAC circuit impedance load with a system (not shown) connected thereto and for outputting the filtered differential analog signal 36, as buffered, to the system.

While the sigma-delta DAC circuit 10 will be described with reference to the 5-bit DAC 30, it should be appreciated that the sigma-delta DAC circuit 10 may be designed using any multi-bit DAC as long as overall system performance parameters are taken into consideration. For example, the sigma-delta DAC circuit 10 may be designed using a 6-bit DAC with 63-bit lines, a 4-bit DAC with 15-bit lines, or an n-bit DAC with $2^{n-1}$ lines. Such a design change would affect overall performance by the quantization noise being proportional to the number of DAC bits, but may still fall within overall system design parameters.

Figure 2:
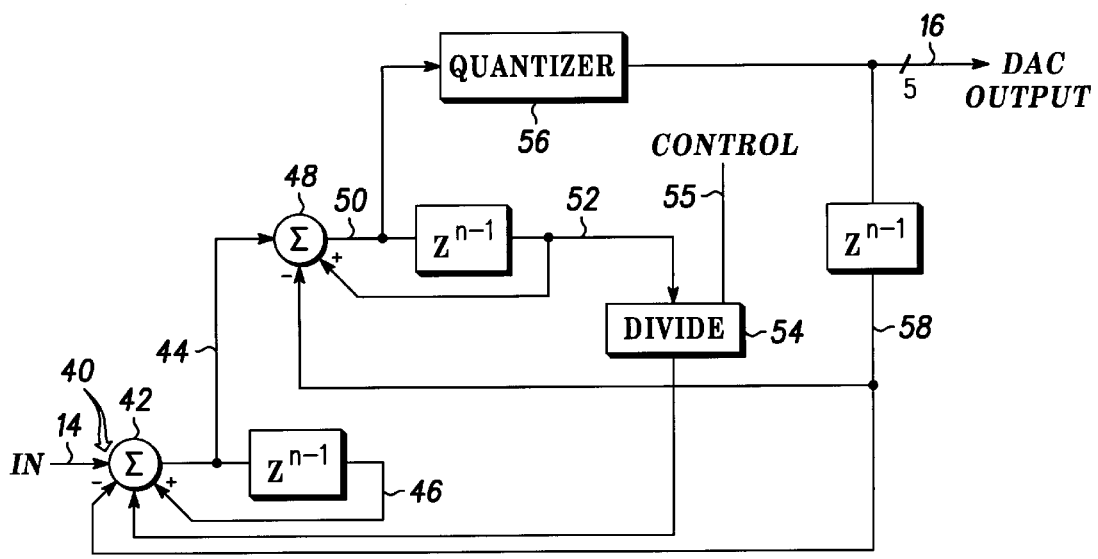
FIG. 2 is a block diagram showing the sigma-delta modulator of FIG. 1 in more detail.

Referring now to FIG. 2, the sigma-delta modulator 12 will now be discussed in more detail. The sigma-delta modulator 12, which is designed to run at a much higher frequency (for example, 120 MHz) compared to the underlying communications system or application (for example 2 MHz), acts effectively as a $2^{nd}$ order highpass filter for filtering the quantization noise. It includes a modulator input 40 for receiving the input signal 14, a first summer 42 connected to the modulator input 40 and having a first summer output 44, and a first integrator feedback loop 46. In addition, a second summer 48 is connected to the first summer output 44 and has a second summer output 50 and a second integrator feedback loop 52. The integrator feedback loops operate to create the required noise transfer function such that quantization noise is spectrally shaped outside the signal passband.

A divider 54 is connected to the second integrator feedback loop 52 for dynamically generating a movable, also referred to as tunable, zero in the noise transfer function outside the passband by dividing a feedback signal output from the second integrator feedback loop 52 by a predetermined amount and feeding the resulting signal back to the first summer 42. The divider 54 dynamically generates the movable zero based on control signals from a microprocessor (not shown) and input into the divider 54 over a control line 55. The control signals may, for example, cause the movable zero to move to 0 Hz (most precision at low frequency) for GSM communications applications, or may cause it to move out of band so that a simpler smoothing filter may be used in, for example, a wideband CDMA application having less stringent in band specifications. The movable zero operates on the quantization noise transfer function not the desired signal transfer function.

The divider 54, which is preferably a shift register, has four possible shift modes: divide by infinity (no feedback); divide by 4 (shift bits to the right by two); divide by 8 (shift bits to the right by three); or divide by 16 (shift bits to the right by four). The output of the divider 54 will effectively depend on the particular application in which the sigma-delta DAC circuit 10 is implemented. For example, if the sigma-delta DAC circuit 10 is implemented in a CDMA communications device, control signals may cause the divider to operate in a divide by 8 shift mode, while control signals may cause the divider to operate in a no shift mode if implemented in a GSM communications device. The divider 54 therefore effectively eliminates the need for a more complex, higher order filter in the analog domain to assist in the noise spectral shaping, as the reconstruction filter 34 will not need to perform as much filtering.

The sigma-delta modulator 12 also includes a quantizer 56 for outputting the 5 most significant bits of the signal output from the second summer output 50. These 5 most significant bits, which are a digital representation of the input signal 14, are output to the differential decoder 18 and are also fed back to the first and second summers 42, 48 via a negative quantizer feedback loop 58. Because the 5 most significant bits are fed back to the first and second summers 42, 48 via the negative quantizer feedback loop 58, the quantizer 56 essentially pushes signal noise to a high frequency by subtracting a past output signal from a cumulative quantization signal each clock cycle. In other words, the sigma-delta modulator 12 integrates signal error to keep track of, and minimize, the error over the long term. The highpass noise filter transfer function of the sigma-delta modulator 12 enables the output of the 5-bit DAC to have a higher associated precision than an output of an analog DAC. As a result, the fact that the quantizer 56 is limited in accuracy due to the low number of analog bits is inconsequential, as signal error will be corrected in the band of interest.

As a result of the above construction, the sigma-delta modulator 12 pushes circuit complexity from the analog realm to the digital realm and therefore reduces the overall size, cost, matching and current or power requirements of the sigma-delta DAC circuit 10. In addition, the design of the sigma-delta modulator 12 results in higher yields in chip fabrication, as circuit complexity is moved to the digital domain and therefore to proven digital libraries.

Figure 3:
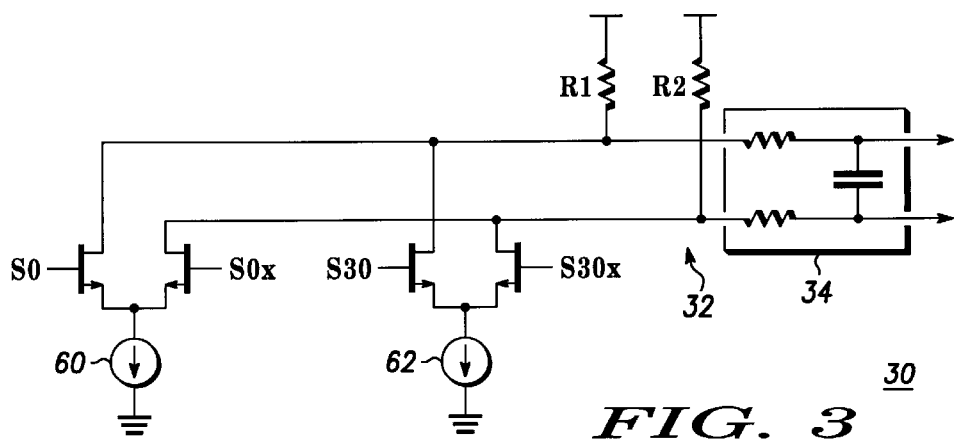
FIG. 3 is a schematic diagram showing the 5-bit DAC of FIG. 1 in more detail.

Referring now to FIG. 3, the 5-bit DAC 30 and the reconstruction filter 34 will now be discussed in more detail. The 5-bit DAC is designed as a differential DAC so that it is immune to common mode noise caused by DAC switching and by other components on the same chip (not shown). It includes 62 identical current steering elements and 31 identical current elements, although only four current steering elements S0, S0x, S31 and S31x and two current elements 60, 62 are shown for ease of illustration, and load resistors R1, R2 that tie the 5-bit DAC to a reference (in this case supply). Each current steering element and its complement such as, for example, the current steering elements S0, S0x, are connected to one of the 31 current elements such as, for example, the current element 60.

Each bit and bit x output from the bit shifter 24 (FIG. 1) is input to respective pairs of current steering elements, such as the current steering elements S0, S0x, to either turn on or turn off one, or both, of the current elements, such as current element 60, to consequently produce the appropriate differential voltage signal 32 that is formed across the resistors R1, R2 and that is input into the reconstruction filter 34, which is a passive RC low pass filter that filters the differential signal 32 at higher frequencies to remove switching noise created by the 5-bit DAC 30.

Figure 4:
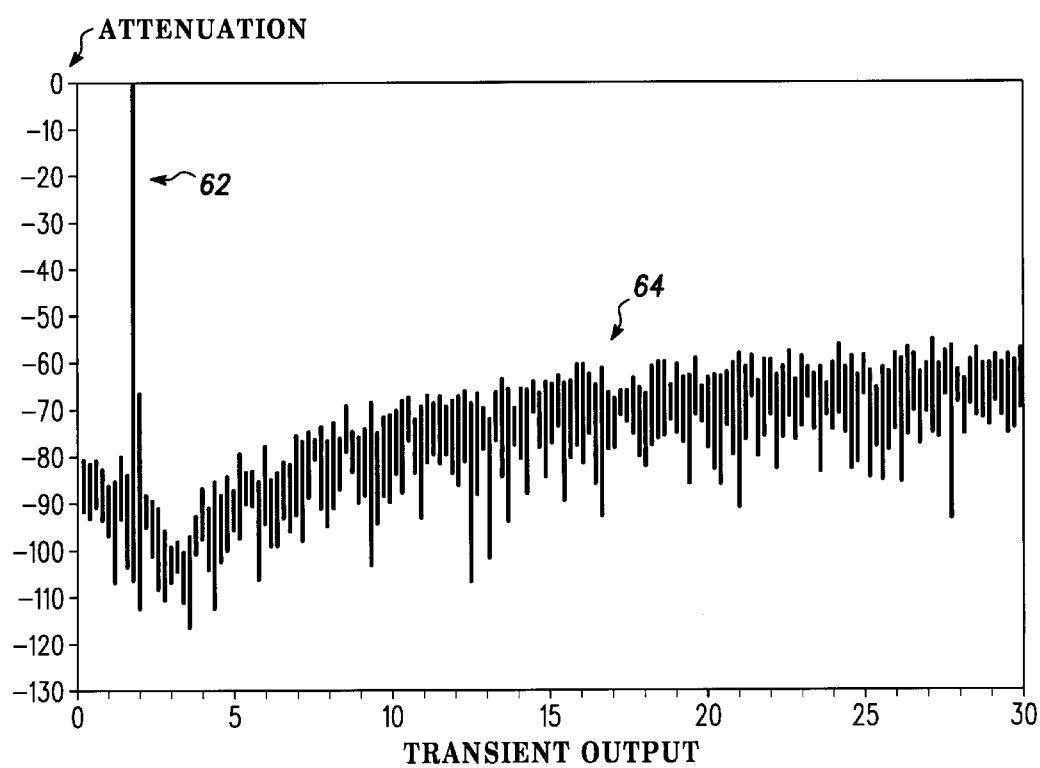
FIG. 4 is a graph showing frequency versus attenuation of a signal output from the sigma-delta DAC circuit shown in FIG. 1.

Referring to FIGS. 1 and 4, operation of the sigma-delta DAC circuit 10 will now be discussed. FIG. 4 graphically illustrates the simulated results of operation of the sigma-delta DAC circuit 10 shown in FIG. 1. As shown in FIG. 4, both a 2 MHz signal 62 and a noise signal 64 are generated by the 5-bit DAC 30 and output by the buffer 38. As shown, the noise signal 64 is attenuated to a level of more than 72 dB below 2 MHz according to simulated application requirements.

As should now be appreciated, the sigma-delta DAC circuit 10 is designed to produce acceptable signal processing results similar to conventional high resolution DAC circuits with tight matching requirements, such as 10-bit or 12-bit analog DAC circuits, in a simpler, less expensive manner, and therefore eliminates the need for such high resolution DACs. This is due in large part to the fact that the noise transfer function transmission zero is digitally and dynamically created by the sigma-delta modulator 12 and this results in the need for lower order analog filters, as quantization noise is pushed to higher frequencies by the sigma delta modulator 12 and the need for midband frequency filtering is reduced. The sigma-delta DAC circuit 10 allows for lower current drain synthesis of required baseband signals, and facilitates spectral shaping of signals to be transmitted without the need for complicated filter topologies. In addition, the unique differential design of the sigma-delta DAC circuit 10 results in better common mode rejection of noise generated by the 5-bit DAC 30 and also a better signal-to-noise ratio. This is because, for example, when a power supply output bounces, both outputs of the 5-bit DAC correspondingly bounce at the same noise level to thereby effectively cancel the noise.

This disclosure is intended to explain how to fashion and use various preferred embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A sigma-delta DAC circuit, comprising:
    a sigma-delta modulator for producing and outputting an n-bit digital signal representative of an analog signal, wherein n is a positive integer greater than 1;
    a differential decoder connected to the sigma-delta modulator for decoding and converting the n-bit digital signal input from the sigma-delta modulator to a $2^{n-1}$-bit digital signal and a $2^{n-1}$-bit inverted digital signal;
    a bit shifter 24 connected to the differential decoder for averaging out bit mismatch in the $2^{n-1}$-bit digital signal and the $2^{n-1}$-bit inverted digital signal input from the differential decoder to produce an averaged $2^{n-1}$-bit digital signal and an averaged $2^{n-1}$-bit inverted digital signal, reducing DAC current source mismatching;
    an n-bit DAC connected to the bit shifter for converting the averaged $2^{n-1}$-bit digital signal and the averaged $2^{n-1}$-bit inverted digital signal input from the bit shifter to a differential analog signal,
    wherein the sigma-delta modulator includes means for effecting a movable zero for enabling dynamic spectral shaping of the differential analog signal.

2. The sigma-delta DAC circuit of claim 1, wherein the movable zero of the sigma-delta modulator is generated through a positive feedback path.

3. The sigma-delta DAC circuit of claim 1, further comprising an $m^{th}$ order reconstruction filter connected to an output of the n-bit DAC for filtering noise from the differential analog signal converted by the n-bit DAC, wherein m is a positive integer greater than 0.

4. The sigma-delta DAC circuit of claim 1, wherein the sigma-delta modulator comprises:
    a modulator input for receiving the input signal;
    a first summer connected to the modulator input and having a first summer output and a first integrator feedback loop;
    a second summer connected to the first summer output and having a second summer output and a second integrator feedback loop;
    a divider connected to the second integrator feedback loop for generating the movable zero by dividing a feedback signal output from the second integrator feedback loop by a dynamically determined amount; and
    a quantizer for outputting n most significant bits of the feedback signal output from the second integrator feedback loop to the differential decoder and for feeding back the n most significant bits to the first and second summers via a quantizer feedback loop.

5. The sigma-delta DAC circuit of claim 1, wherein the means for effecting a movable zero includes a divider for dynamically controlling the movable zero at a predetermined location based on spectral requirements set by signal modulation.

6. The sigma-delta DAC circuit of claim 5, wherein the divider includes a control line for dynamically changing the noise transfer function in response to application requirements.

7. The sigma-delta DAC circuit of claim 1, wherein the n-bit DAC comprises:
    a DAC input for receiving the averaged $2^{n-1}$ bit digital signal and the averaged $2^{n-1}$ bit inverted digital signal input from the bit shifter; and
    $2^{n-1}$ current steering elements for receiving respective bits from the averaged $2^{n-1}$ bit digital signal and the averaged $2^{n-1}$ bit inverted digital signal and for being turned on or off based on values of corresponding bits in the averaged $2^{n-1}$ bit digital signal and the averaged $2^{n-1}$ bit inverted digital signal.

8. The sigma-delta DAC circuit of claim 7, wherein the $2^{n-1}$ current steering elements of the n-bit DAC comprise identical current steering elements.

9. A sigma-delta DAC circuit, comprising:
    a sigma-delta modulator for producing and outputting an n-bit digital signal representative of an input signal, wherein the sigma-delta modulator includes means for effecting a controllable zero for enabling dynamic spectral shaping of a noise signal corresponding to the n-bit digital signal and wherein n is a positive integer greater than 0;
    a differential decoder connected to the sigma-delta modulator for decoding and converting the n-bit digital signal input from the sigma-delta modulator to a $2^{n-1}$ bit digital signal and a $2^{n-1}$ bit inverted digital signal;
    a bit shifter connected to the differential decoder for averaging out bit mismatch in the $2^{n-1}$ bit digital signal and the $2^{n-1}$ bit inverted digital signal input from the differential decoder to produce an averaged $2^{n-1}$ bit digital signal and an averaged $2^{n-1}$ bit inverted digital signal;

an n-bit DAC connected to the bit shifter for converting the averaged $2^{n-1}$ bit digital signal and the averaged $2^{n-1}$ bit inverted digital signal input from the bit shifter to a differential analog signal.

10. The sigma-delta DAC circuit of claim 9, further comprising an $m^{th}$ order reconstruction filter connected to an output of the n-bit DAC for filtering noise from the differential analog signal converted by the n-bit DAC, wherein m is a positive integer greater than 0.

11. The sigma-delta DAC circuit of claim 10, further comprising a buffer connected to an output of the reconstruction filter for matching a sigma-delta DAC circuit impedance load with a system connected thereto.

12. The sigma-delta DAC circuit of claim 11, wherein the n-bit DAC comprises one of a 4-bit, 5-bit and 6-bit DAC.

13. The sigma-delta DAC circuit of claim 9, wherein the sigma-delta modulator comprises:

a modulator input for receiving the input signal;

a first summer connected to the modulator input and having a first summer output and a first integrator feedback loop;

a second summer connected to the first summer output and having a second summer output and a second integrator feedback loop;

a divider connected to the second integrator feedback loop for generating the movable zero by dividing a feedback signal output from the second integrator feedback loop by a dynamically determined amount; and a quantizer for outputting n most significant bits of the feedback signal output from the second integrator feedback loop to the differential decoder and for feeding back the n most significant bits to the first and second summers via a quantizer feedback loop.

14. The sigma-delta DAC circuit of claim 9, wherein the means for effecting a controllable zero includes a divider for dynamically positioning the movable zero at a predetermined location based on spectral shaping requirements.

15. The sigma-delta DAC circuit of claim 9, wherein the n-bit DAC comprises:

a DAC input for receiving the averaged $2^{n-1}$ bit digital signal and the averaged $2^{n-1}$ bit inverted digital signal input from the bit shifter; and $2^{n-1}$ current steering elements for receiving respective bits from the averaged $2^{n-1}$ bit digital signal and the averaged $2^{n-1}$ bit inverted digital signal and for being turned on or off based on values of corresponding bits in the averaged $2^{n-1}$ bit digital signal and the averaged $2^{n-1}$ bit inverted digital signal.

16. The sigma-delta DAC circuit of claim 15, wherein the $2^{n-1}$ current elements of the n-bit DAC comprise identical current elements.

17. The sigma-delta DAC circuit of claim 14, wherein the divider includes a control line for receiving shift mode instructions for dynamically shifting the movable zero.

18. The sigma-delta DAC circuit of claim 9, wherein the n-bit DAC comprises one of a 4-bit, 5-bit and 6-bit DAC.

19. A sigma-delta modulator for a sigma-delta DAC circuit, comprising:

a modulator input for receiving an input high resolution digital signal;

a first summer connected to the modulator input and having a first summer output and a first integrator feedback loop;

a second summer connected to the first summer output and having a second summer output and a second integrator feedback loop;

a divider connected to the second integrator feedback loop for generating a movable zero by dividing a feedback signal output from the second integrator feedback loop by a dynamically determined amount; and a quantizer for outputting n most significant bits of the feedback signal output from the second integrator feedback loop to the differential decoder and for feeding back the n most significant bits to the first and second summers via a quantizer feedback, wherein n is a positive integer greater than 1.

20. The sigma-delta modulator of claim 19, wherein the n most significant bits comprises one of the four, five and six most significant bits.

* * * * *

UNITED STATES PATENT AND TRADEMARK OFFICE
CERTIFICATE OF CORRECTION

PATENT NO. : 6,677,876 B1
DATED : January 13, 2004
INVENTOR(S) : Hoggarth et al.

It is certified that error appears in the above-identified patent and that said Letters Patent is hereby corrected as shown below:

Column 5,
Line 53, please delete "wherein" and add -- where --.

Signed and Sealed this

Twenty-ninth Day of June, 2004

JON W. DUDAS
*Acting Director of the United States Patent and Trademark Office*